(12) United States Patent
Blanchard (10) Patent No.: US 6,316,336 B1
(45) Date of Patent: Nov. 13, 2001

(54) METHOD FOR FORMING BURIED LAYERS WITH TOP-SIDE CONTACTS AND THE RESULTING STRUCTURE

(76) Inventor: Richard A. Blanchard, 10724 Mora Dr., Los Altos, CA (US) 94024

( * ) Notice: Subject to any disclaimer, the term of this patent is extended or adjusted under 35 U.S.C. 154(b) by 0 days.

(21) Appl. No.: 09/516,009

(22) Filed: Feb. 29, 2000

Related U.S. Application Data (60) Provisional application No. 60/122,279, filed on Mar. 1, 1999.

(51) Int. Cl.[7] .................................................... H01L 21/36
(52) U.S. Cl. ............................................. 438/478; 438/524
(58) Field of Search ................................... 438/524, 526, 438/530, 545, 478; 257/301

(56) References Cited

U.S. PATENT DOCUMENTS

| | | |
|---|---|---|
| 3,976,512 | 8/1976 | De Nora et al. . |
| 4,044,452 | 8/1977 | Abbas et al. . |
| 5,959,324 * | 9/1999 | Kohyama ............................. 257/301 |

FOREIGN PATENT DOCUMENTS

| | | |
|---|---|---|
| 92830455.9 | 3/1994 | (EP) . |
| 58250536 | 12/1983 | (JP) . |
| 04184833 | 7/1992 | (JP) . |
| WO 99/16123 | 9/1997 | (WO) . |

\* cited by examiner

*Primary Examiner*—David Nelms
*Assistant Examiner*—David Vu
(74) *Attorney, Agent, or Firm*—Richard K. Robinson (57) ABSTRACT

A buried layer of dopant is formed in a semiconductor by etching a series of trenches, then depositing dopant at the bottom of the trenches and diffusing until the dopant from different trenches meet to form a continuous layer. Depending on the material used to fill the trenches, the buried layer can be contacted or isolated. With this method, it becomes unnecessary to grow expensive epitaxial layers.

20 Claims, 9 Drawing Sheets

METHOD FOR FORMING BURIED LAYERS WITH TOP-SIDE CONTACTS AND THE RESULTING STRUCTURE

CROSS-REFERENCE TO OTHER APPLICATION

This application claims priority from Ser. No. 60/122,279 filed Mar. 1, 1999, filed Mar. 01, 1999, which is hereby incorporated by reference.

BACKGROUND AND SUMMARY OF THE INVENTION

The present invention relates to the formation of integrated circuits in semiconductors, and especially to the formation of buried layers in a semiconductor.

Background: Buried Layers in Semiconductor Processing

Buried layers are regions of dopant that are formed beneath the surface of wafers in semiconductor processing technology. Buried layers are most often formed by introducing regions of the desired dopant into the surface of a wafer early in the semiconductor manufacturing sequence and then depositing an additional layer of the semiconductor material over the surface of the entire wafer, thereby "burying" the newly introduced doped region. The process step used to deposit the additional layer of semiconductor material is called epitaxial deposition. Following the epitaxial deposition step, the crystal structure of the deposited material matches the crystal structure of the original wafer. Dopant is added in the deposition step to guarantee that the epitaxial layer has the desired dopant type and range of dopant concentration.

Figure 2A:
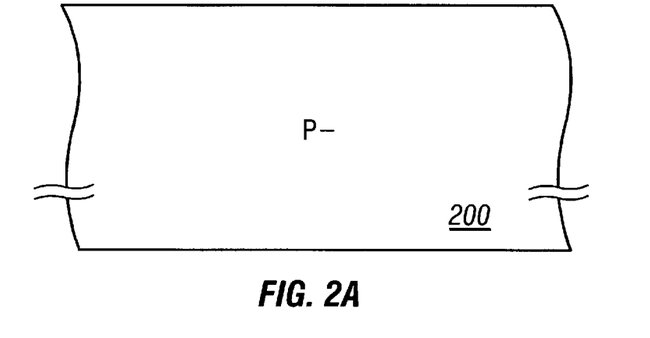
FIGS. 2A–C demonstrate the conventional method of forming a buried layer using an epitaxial layer.
Figure 2B:
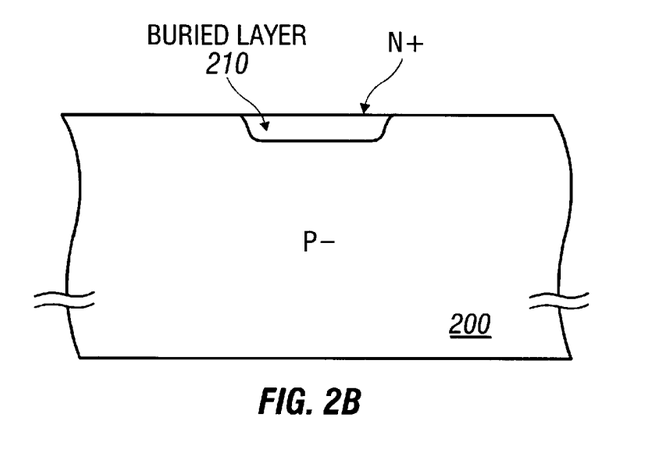
Figure 2C:
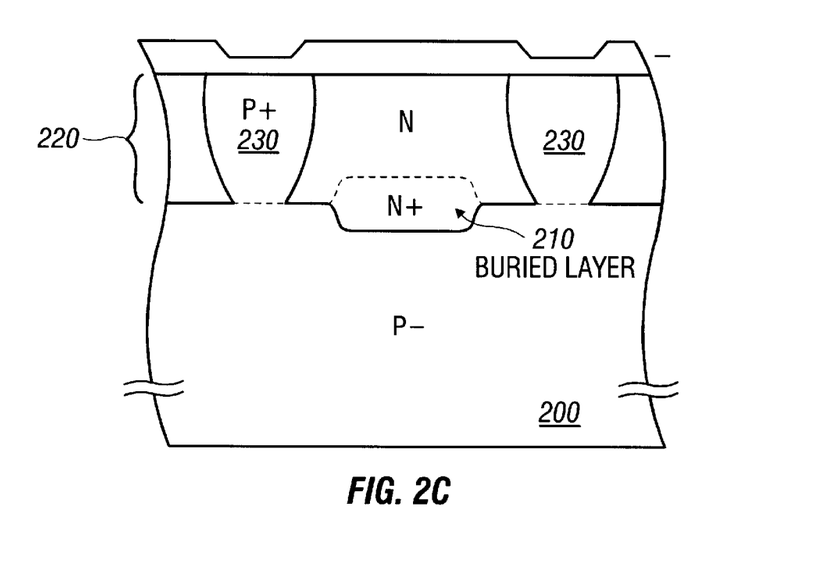

The sequence of forming a buried layer under an epitaxial layer is shown in FIGS. 2A–2C. FIG. 2A shows a cross section of a semiconductor wafer at the beginning of circuit fabrication, showing only the substrate 200. FIG. 2B shows the same wafer after a doped region 210, which will become the buried layer, has been formed. After the doped regions 210 is formed, epitaxial layer 220 is grown, and reach-down contacts 230 are implanted or deposited and diffused. The wafer with buried layer 210' is seen in FIG. 2C. The use of epitaxial deposition and a diffused isolation region as shown in FIG. 2C allows the formation of regions of semiconductor material that are electrically isolated from each other while being in close physical proximity. The buried layer reduces the resistance of the electrical path that current must flow through in an integrated circuit.

The epitaxial deposition step in the formation of buried layers is a costly step, so alternative methods of forming buried layers have been investigated. One such technique is to use high-energy ion implantation to introduce the buried layer dopant atoms into the semiconductor material at a depth below the surface of the semiconductor. The depth that dopant atoms can be introduced using ion implantation is limited to just a few microns due to the energy required to implant the atoms deeper. The introduction of the high doses of dopant required for some buried layers may also permanently alter the characteristics of the semiconductor material that the dopant atoms pass through during the ion implantation step.

Forming a Buried Layer Without Epitaxy

It is herein disclosed to form buried layers in a semiconductor by first forming trenches in the semiconductor wafer, using conventional lithographic and etching techniques. After formation of a layer of dielectric on the bottom and sides of the trenches, a dopant is introduced into the silicon beneath the trenches. The trenches will be filled, either with a dielectric or a conductor, as desired for the particular layout, then the dopant is caused to diffuse until the regions from the trenches meet and merge, forming a continuous buried layer underneath the surface of the wafer.

The disclosed innovations, in various embodiments, provide one or more of at least the following advantages:

no need to grow epitaxial layers;
less expensive than other methods;
buried layer can be at any depth;
multiple layers can be formed in various configurations;
overlying semiconductor is not altered, as in ion implantation.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

The present invention allows the formation of buried layers at any depth in a wafer without the use of epitaxial deposition. A process sequence for this technique is shown in FIGS. 1A–1D. Using this technique, either n-type or p-type buried layers may be obtained. The depth of the buried layers is a function of the depth of the trenches formed in the semiconductor material, while the dopant concentration is determined by the amount of dopant introduced, and the subsequent diffusions performed. These parameters also determine the thickness of the buried layers as well as their lateral and vertical profiles.

Figure 1A:
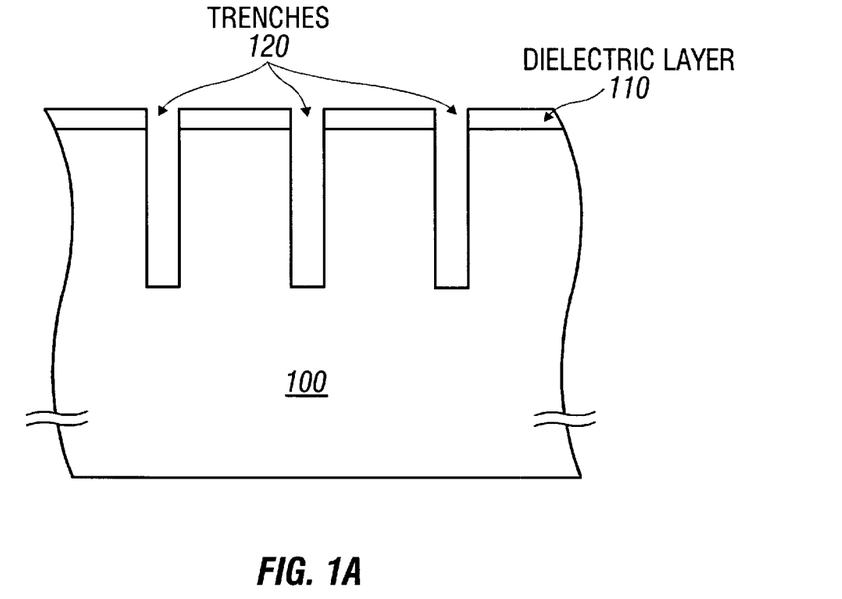
FIGS. 1A–D demonstrate the steps of the disclosed method of forming a buried layer.

Looking at FIG. 1A, a dielectric layer 110 is either grown or deposited over substrate 100. Known photolithographic techniques are used to form a pattern over the dielectric, with a subsequent etch step forming trenches 120 of the desired depth through the dielectric and into the substrate 100.

Figure 1B:
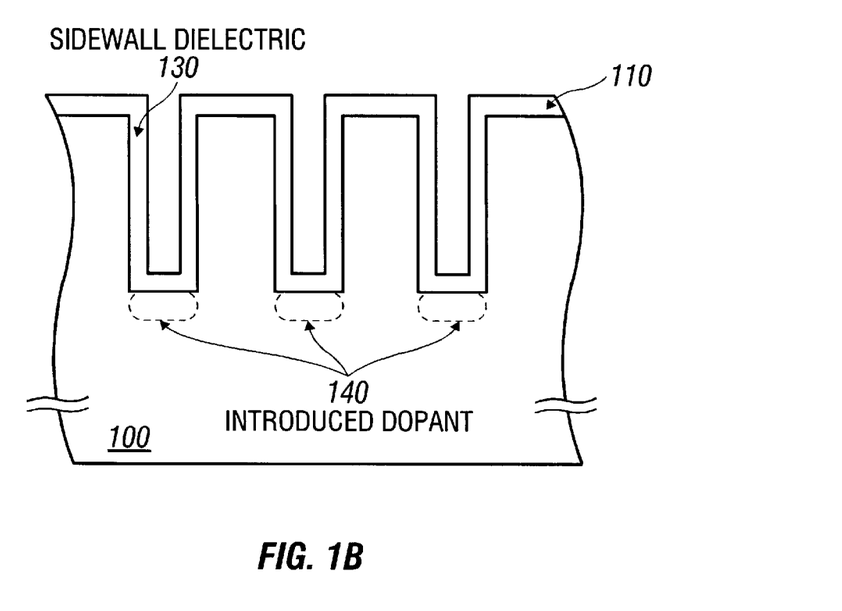

As seen in FIG. 1B, a dielectric layer 130 is typically grown or deposited on the sides and bottom of the trenches 120. A desired dopant 140 is then introduced into the substrate at the bottom of the trenches. This can be done by using ion implantation, using the same mask used to etch the trenches. Alternatively, the dielectric layer 130 at the bottom of the trenches can be cleared and the dopant 140 deposited directly onto the cleared area.

Figure 1C:
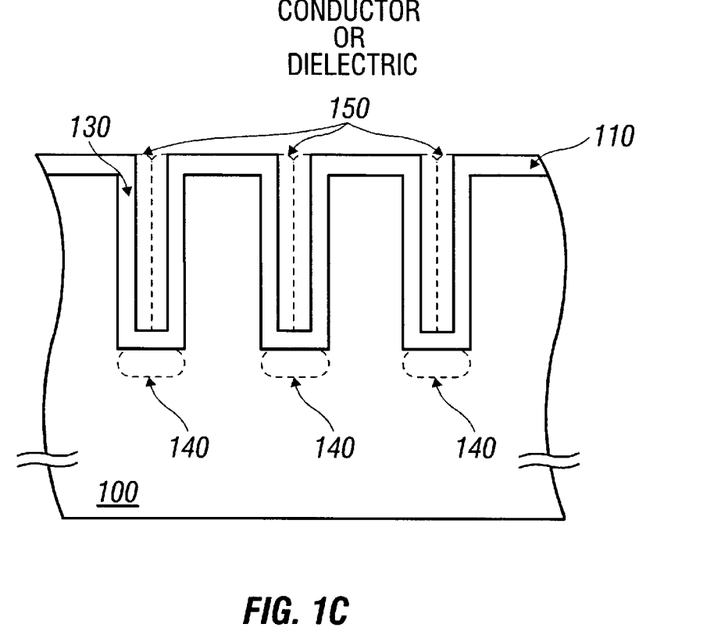

Following introduction of the dopant 140 into the substrate 100, the trenches 120 are filled, either by growing or depositing the desired filling material 150 in the trenches, shown in FIG. 1C.

Figure 1D:
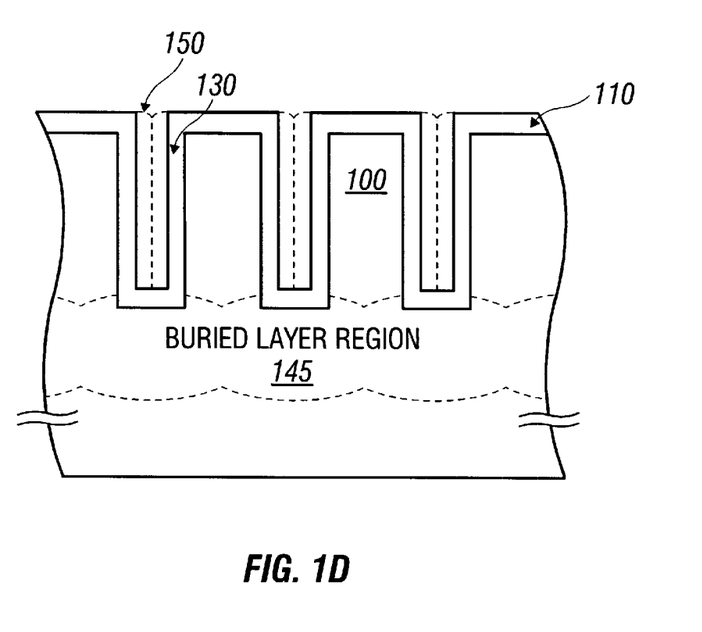

Finally, the wafer is subjected to a diffusion process, generally a heat treatment, which causes the dopant to be dispersed. FIG. 1D shows this process after the diffusion has proceeded until the separate dopant regions 140 have diffused to form a single buried layer region 145.

The trenches must be spaced so as to allow the resulting diffused buried layer regions to overlap, forming a continuous buried layer. The trenches may be filled by depositing or growing either a dielectric such as silicon dioxide or silicon nitride, or a conductor such as doped polycrystalline silicon, tungsten, or a metal silicide. If an insulator is used to fill the trench, there is no electrical path from the wafer surface to the buried layer through the trench. However, a dielectric filled trench that completely surrounds an area does provide lateral isolation. If, alternatively, the dielectric at the bottom of the trench is removed and the trench is filled with a conductor, an electrical path is present inside the trench from the top surface to the buried layer.

Alternative Method: Depositing Dopant-Rich Material

Figure 3:
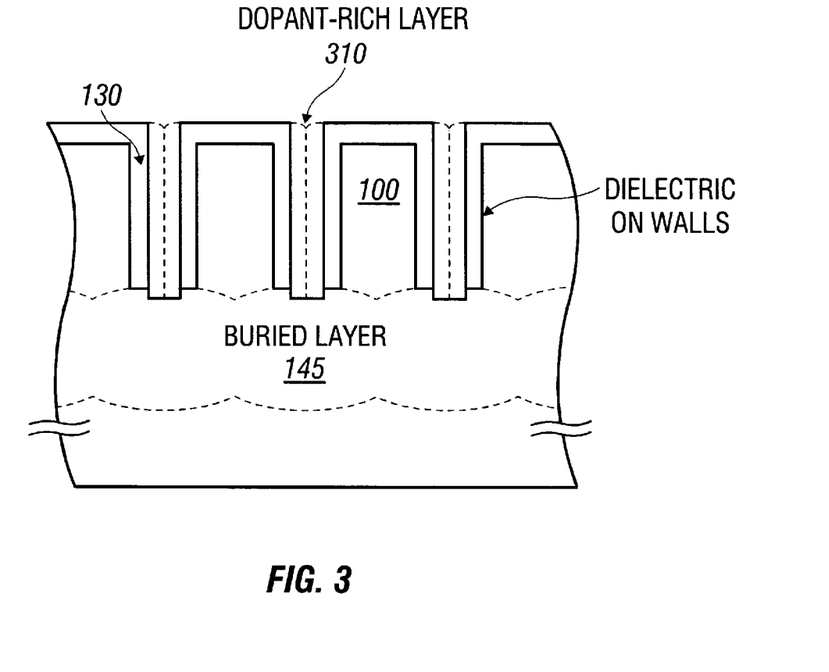
FIG. 3 demonstrates one embodiment of a buried layer formed by the disclosed method.

In a variation of the process seen in FIG. 3, following formation of the dielectric 130 on the sides and bottom of the trenches, the dielectric at the bottom of the trenches may be etched away along with a small amount of additional silicon from the bottom of the trenches. A dopant-rich layer of material 310 such as doped polycrystalline silicon or doped silicon dioxide is deposited in the trenches and diffused into the silicon to form the buried layer.

Alternative Method: Lateral Isolation with Dopant-Rich Material

Figure 4:
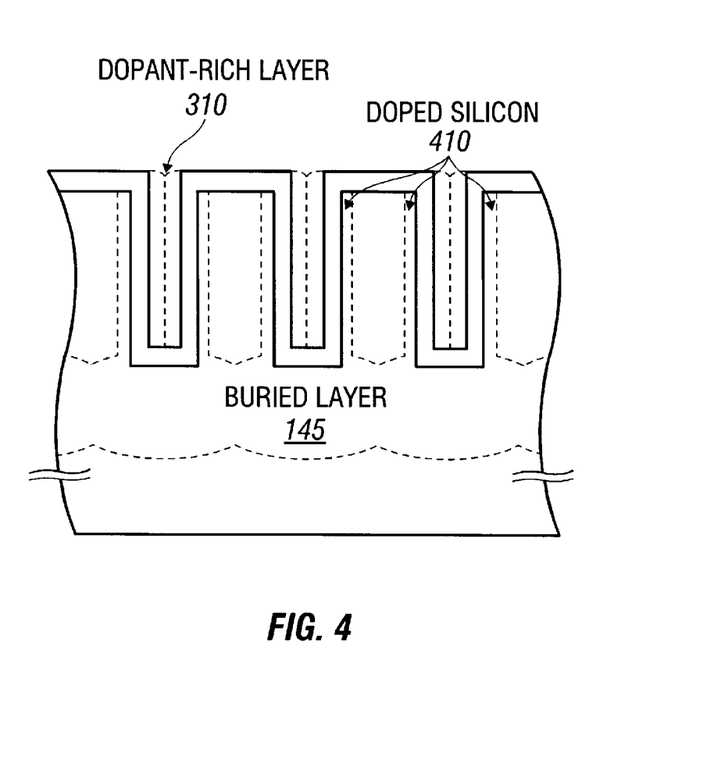
FIG. 4 demonstrates an alternate embodiment of a buried layer formed by the disclosed method.

FIG. 4 shows another alternate method in which the walls of the trenches are also doped, providing lateral junction isolation 410 in addition to being used to form the buried layers. In this process sequence, the buried layer dopant is first introduced and diffused without filling the trenches used for introducing the buried layer dopant. The dielectric is next removed from both the walls and the bottoms of the trenches, and a dopant rich layer of material is deposited, followed by a diffusion step. (It is also possible to etch the dielectric layer from both the walls and the bottoms of the trenches, and to deposit a dopant rich layer before the buried layer diffusion is performed.)

Alternate Method: Variations in Buried Layer Shapes

Buried layer regions of almost any shape may be formed using this technique, with three variations shown below.

Figure 5A:
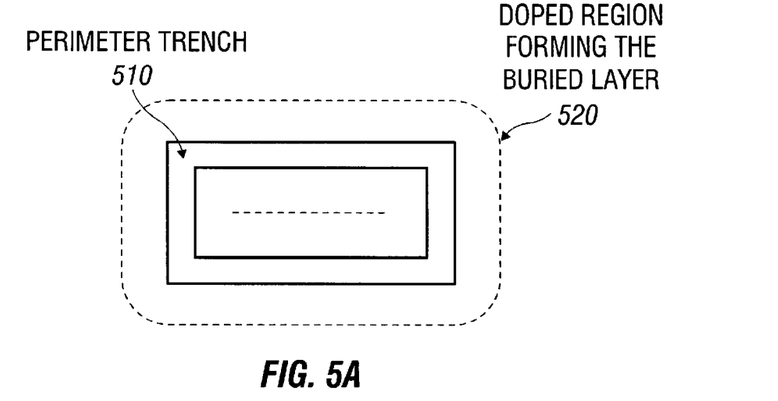
FIGS. 5A–C show top views of various buried layer configurations that may be obtained using the disclosed technique.

FIG. 5A shows a region that is surrounded by a trench 510, with a buried layer 520 that has diffused from just the trench.

Figure 5B:
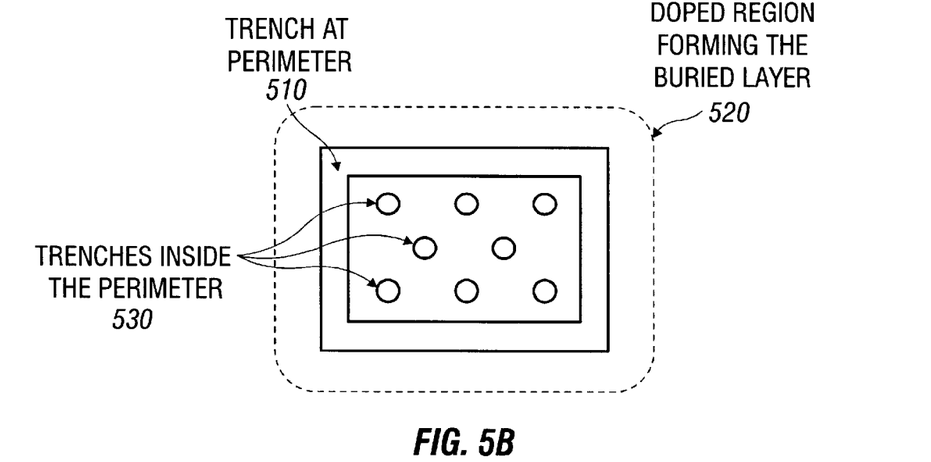

FIG. 5B shows a region that is surrounded by a trench 510, with a buried layer 520 that has diffused from the trench at the perimeter of the region as well as from holes or trenches 530 that are interior to the region.

Figure 5C:
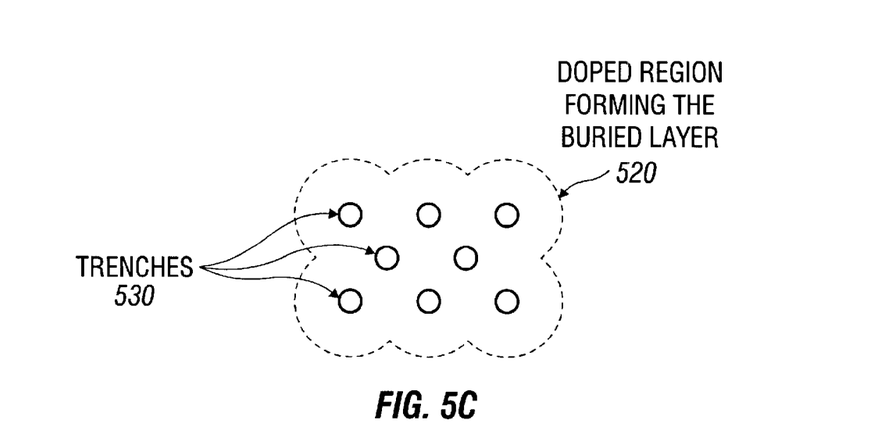

FIG. 5C shows a region with no trench at its perimeter, having a buried layer 520' that has diffused from holes or trenches 530 that are only interior to the region.

The buried layer does not have to be continuous. It may also have one or more regions or "holes" that contain no buried layer dopant.

Alternative Methods: Two or More Buried Layers

Figure 6:
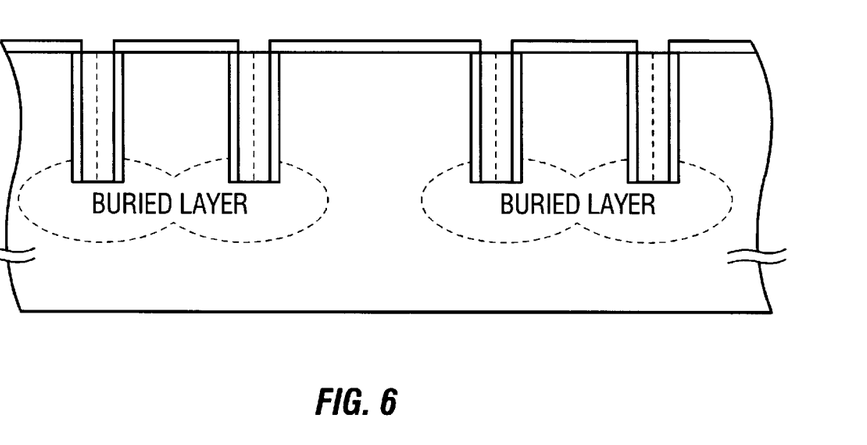
FIG. 6 shows two buried layer regions which were formed simultaneously.

It is possible to simultaneously fabricate multiple, non-overlapping buried layers of a single dopant type, as seen in the cross-section in FIG. 6.

Figure 7:
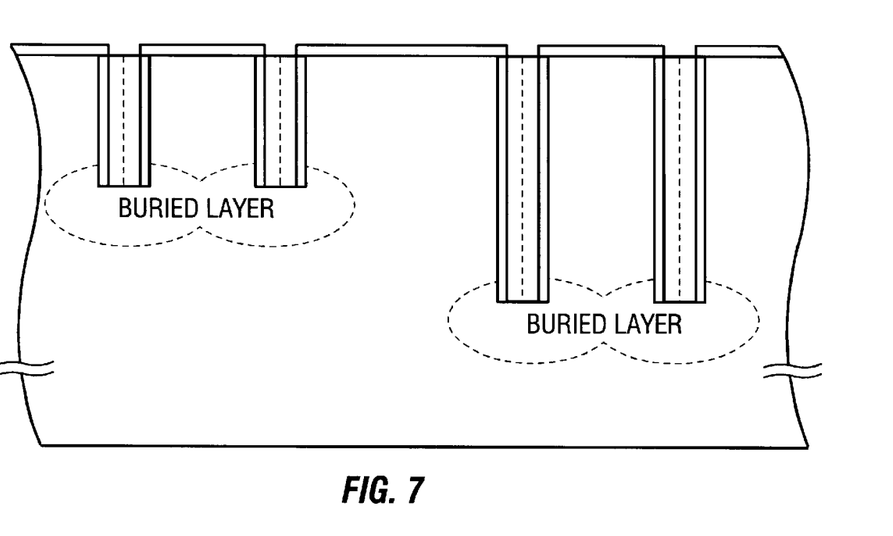
FIG. 7 shows two buried layer regions which were formed sequentially.

By selecting the depth of the trenches, it is also possible to sequentially fabricate nearly adjacent buried layers that are at different depths, as shown in FIG. 7, thus requiring less surface area for a given device. These buried layers may be of similar dopant types and/or concentrations, or they may be completely different from each other.

Figure 8A:
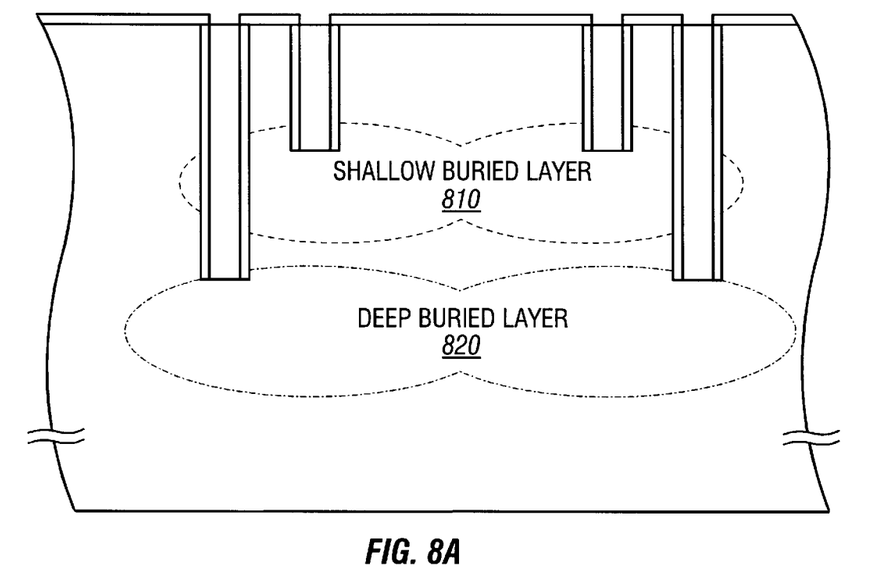
FIGS. 8A–B show two configurations of overlapping buried layers at different depths.
Figure 8B:
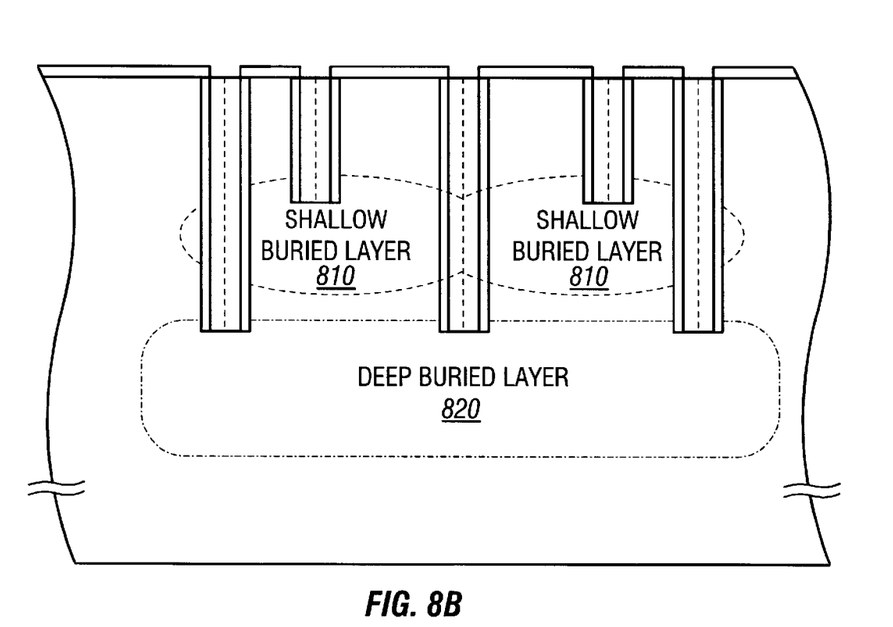

A significant benefit of this buried layer formation technique is the ability to confine the buried layer access region to just the area inside the trench when the dielectric is left on the walls of the trench. FIGS. 8A and 8B show a first buried layer 810 which completely overlies a second, deeper buried layer 820. In FIG. 8A, the deeper buried layer 820 is formed using trenches that are outside the shallower buried layer 810, while in FIG. 8B, the deeper buried layer 820 is formed using trenches that extend through the shallower buried layer 810.

Alternate Methods: Two Buried Layers Using the Same Trenches

Figure 9:
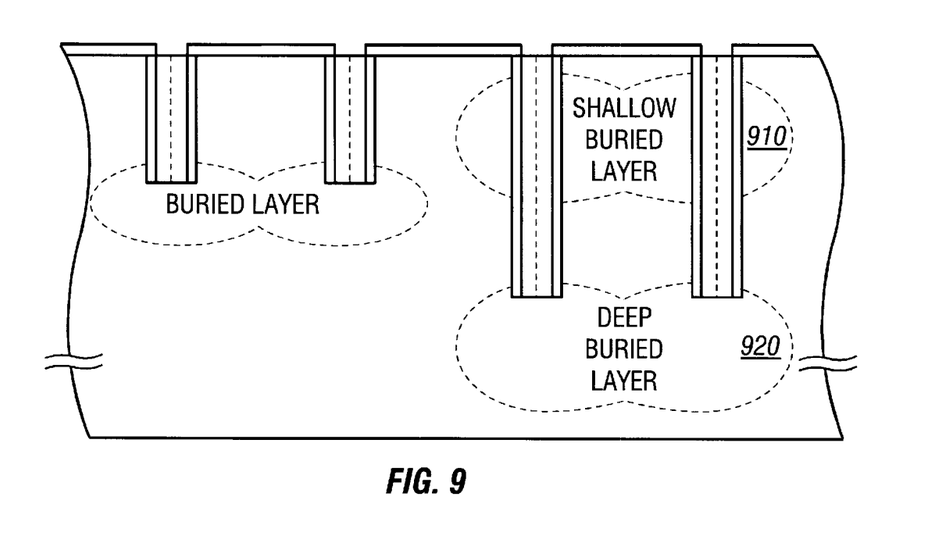
FIG. 9 shows two overlapping buried layers at different depths that have been formed using the same trenches.

Buried layers with the same dopant concentrations, buried layers with the same dopant species, buried layers with different dopant concentrations, and buried layers with different dopant species may also be formed sequentially using the same trench openings by introducing one dopant species into the semiconductor at a first trench depth, performing the first buried layer diffusion to form shallow buried layer 910, continuing the silicon etch to a second depth, and then performing a second buried layer doping step to form deep buried layer 920 as shown in FIG. 9. This sequence may be repeated multiple times.

Figure 10:
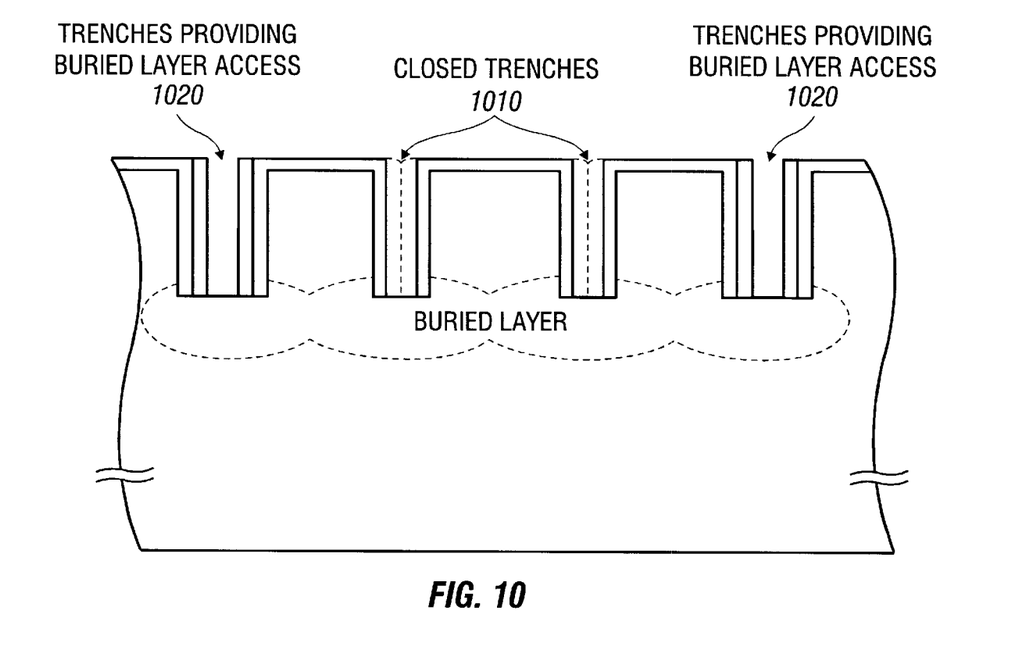
FIG. 10 shows trenches of different widths used to provide access to the buried layer at selected trenches.

Alternate Methods: Multiple Width Trenches to Provide Access at Selected Trenches In an further alternative embodiment, the width of the trenches are varied, so that it is possible to fill some of the trenches after the first group of buried layers is formed while leaving other trenches unfilled. In the step shown in FIG. 10, deposition of material on the sidewalls of the thinner trenches 1010 has completely closed these trenches, while leaving wider trenches 1020 still open. At this step in the process sequence, one can remove the dielectric from the bottoms of the trench or from both the side walls and the bottoms of the trenches, and fill the open trenches with a conductor, forming a low resistance electrical path to the buried layers.

Alternate Methods: Multiple Buried Layers with Different Width Trenches

Figure 11:
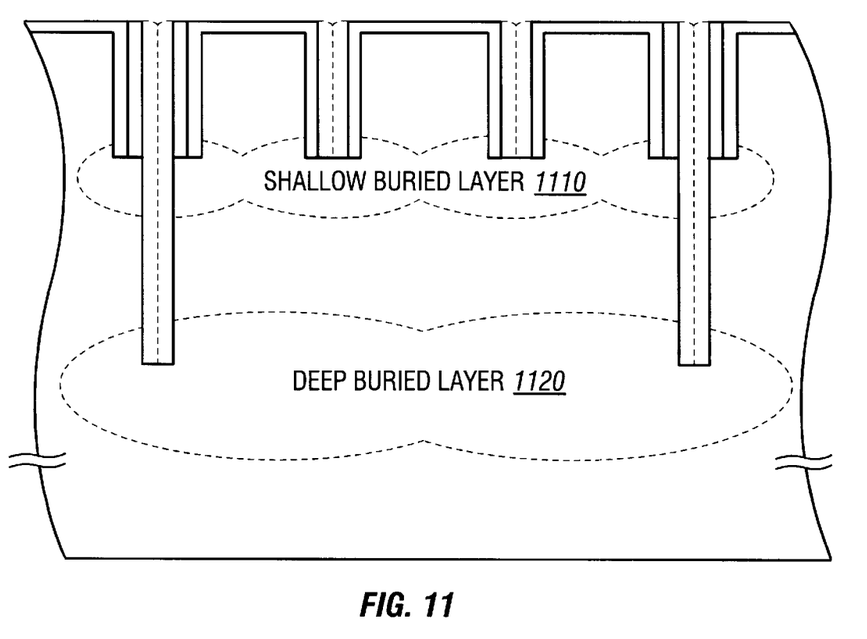
FIG. 11 shows the use of trenches with different widths to form buried layers at different depth using some of the same trenches.

In a further alternate embodiment, a first group of buried layers 1110 is formed at one depth using a combination of trenches with two or more widths. The thickness of the layer that is deposited in the trenches after the introduction of the dopant for the first buried layers is chosen so that it fills only the narrowest group of trenches. An anisotropic etch step is used to remove the deposited layer from the bottom of the unfilled trenches, and these trenches are etched to a greater depth. A second buried layer ion implantation step is next performed at the bottoms of the open trenches to form a second set of buried layers 1120 as shown in FIG. 11. This sequence may be used multiple times to form a variety of buried layer structures.

According to a disclosed class of innovative embodiments, there is provided: A fabrication method, comprising the steps of: introducing a dopant at the bottom of first and second trenches which have been formed in a semiconductor substrate; performing diffusion of said dopant to form a buried layer between said first and second trenches.

According to another disclosed class of innovative embodiments, there is provided: A fabrication method, comprising the steps of: etching first and second trenches in a semiconductor substrate; introducing a dopant at the bottom of said first and second trenches; filling said first and second trenches; performing diffusion of said dopant to form a buried layer between said first and second trenches.

According to another disclosed class of innovative embodiments, there is provided: An integrated circuit, comprising a buried layer of dopant formed by the method of: etching first and second trenches in a semiconductor substrate; introducing a dopant at the bottom of said first and second trenches; filling said first and second trenches; performing diffusion of said dopant to form said buried layer between said first and second trenches.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A fabrication method, comprising the steps of:
   introducing a dopant at the bottom of first and second trenches which have been formed in a semiconductor substrate;
   performing diffusion of said dopant to form a first buried layer between said first and second trenches;
   forming an electrical contact to the buried layer through at least one of the first and second trenches; and
   using said first and second trenches to form a second buried layer at a depth which is different from the depth of said first buried layer.

2. The method of claim 1, wherein said dopant is N-type.
3. The method of claim 1, wherein said dopant is P-type.
4. The method of claim 1, wherein said first buried layer is continuous.
5. The method of claim 1, further comprising filling said first and second trenches with a dielectric.
6. The method of claim 1, further comprising the step of forming a dielectric on the sidewalls of said first and second trenches.
7. The method of claim 1, further comprising the step of forming a dopant-rich layer surrounding said first and second trenches.
8. The method of claim 1, further including the step of forming an electrical contact to the second buried layer through at least one of the first and second trenches.

9. A fabrication method, comprising the steps of:
   introducing a dopant at the bottom of first and second trenches which have been formed in a semiconductor substrate;
   performing diffusion of said dopant to form a first buried layer between said first and second trenches;
   forming an electrical contact to the buried layer through at least one of the first and second trenches; and
   using third and fourth trenches to form a second buried layer at a depth which is different from the depth of said first buried layer.

10. The method of claim 9, further comprising the step of forming an electrical contact to the buried layer through at least one of said third and fourth trenches.

11. A fabrication method, comprising the steps of:
    etching first and second trenches in a semiconductor substrate;
    introducing a dopant at the bottom of said first and second trenches;
    filling said first and second trenches;
    performing diffusion of said dopant to form a first buried layer between said first and second trenches; and
    forming an electrical contact to the first buried layer through at least one of the first and second trenches; and
    using said first and second trenches to form a second buried layer at a depth which is different from the depth of said first buried layer.

12. The method of claim 11, wherein said first buried layer is continuous.
13. The method of claim 11, further comprising filling at least one of said first and second trenches with a dielectric.
14. The method of claim 11, further comprising the step of forming a dielectric on the sidewalls of said first and second trenches.
15. The method of claim 11, further comprising the step of forming a dopant-rich layer surrounding said first and second trenches.
16. The method of claim 11, further comprising the step of forming an electrical contact to the buried layer through at least one of said first and second trenches.

17. An integrated circuit, comprising a buried layer of dopant formed by the method of:
    etching first and second trenches in a semiconductor substrate;
    introducing a dopant at the bottom of said first and second trenches;
    filling said first and second trenches;
    performing diffusion of said dopant to form said buried layer between said first and second trenches;
    forming an electrical contact to the buried layer through at least one of the first and second trenches; and
    using said first and second trenches to form a second buried layer at a depth which is different from the depth of said first buried layer.

18. The circuit of claim 17, wherein said dopant is N-type.
19. The circuit of claim 17, wherein said dopant is P-type.
20. The circuit of claim 17, wherein said method of forming said circuit further comprises the step of forming a dielectric on the sidewalls of said first and second trenches.

* * * * *